United States Patent [19]

Zeiler

[11] Patent Number: 4,937,470
[45] Date of Patent: Jun. 26, 1990

[54] DRIVER CIRCUIT FOR POWER TRANSISTORS

[76] Inventor: Kenneth T. Zeiler, 526 Park La., Richardson, Tex. 75081

[21] Appl. No.: 197,310

[22] Filed: May 23, 1988

[51] Int. Cl.$^5$ .................. H03K 3/01; H03K 17/60; H01P 1/22; G05F 1/40
[52] U.S. Cl. .................... 307/270; 307/254; 307/571; 307/246; 307/540; 323/289
[58] Field of Search ............ 307/270, 254, 246, 571, 307/280, 300, 540, 549, 551; 330/264, 269, 300; 323/289

[56] References Cited

U.S. PATENT DOCUMENTS

| | | | |
|---|---|---|---|
| 3,611,021 | 10/1971 | Wallace | 315/239 |
| 3,648,106 | 3/1972 | Engel et al. | 315/291 |
| 3,681,654 | 8/1972 | Quinn | 315/151 |
| 3,753,071 | 8/1973 | Engel et al. | 315/DIG. 7 |
| 3,828,208 | 8/1974 | Kelleher | 307/280 |
| 3,832,627 | 8/1974 | Ohsawa | 323/277 |
| 4,115,740 | 9/1978 | Yoshida et al. | 330/269 |
| 4,188,660 | 2/1980 | Knoll | 363/49 |
| 4,251,752 | 2/1981 | Stolz | 315/206 |
| 4,346,332 | 8/1982 | Walden | 315/307 |
| 4,423,341 | 12/1983 | Shelly | 307/570 |
| 4,443,719 | 4/1984 | Planer et al. | 307/570 |
| 4,453,089 | 6/1984 | Shuey et al. | 307/280 |
| 4,455,526 | 6/1984 | Miller | 323/289 |
| 4,461,966 | 7/1984 | Hebenstreit | 307/246 |
| 4,493,017 | 1/1985 | Kammiller et al. | 323/289 |
| 4,516,041 | 5/1985 | Quan | 307/494 |
| 4,630,164 | 12/1986 | Olsson | 330/264 |
| 4,694,026 | 9/1987 | Weinberg | 307/270 |
| 4,717,863 | 1/1988 | Zeiler | 315/307 |
| 4,767,952 | 8/1988 | Nollet | 307/270 |

FOREIGN PATENT DOCUMENTS 8302537 7/1983 World Int. Prop. O. .

Primary Examiner—Stanley D. Miller
Assistant Examiner—Trong Quang Phan
Attorney, Agent, or Firm—Richards, Medlock & Andrews

[57] ABSTRACT

A gate driver circuit is provided for push-pull power transistors. Inverse square wave signals are provided to each of the driver circuits for activating the power transistors. The combination of an inductor and diodes provides a delay for activating the corresponding power transistor at a positive transition of the control signal, but do not have a significant delay at the negative transition. This provides protection to prevent the power transistors from being activated concurrently while having lower power loss at high drive frequencies. The control terminal for each power transistor is connected to a voltage clamping circuit to prevent the negative transition from exceeding a predetermined limit.

5 Claims, 1 Drawing Sheet

U.S. Patent     Jun. 26, 1990     4,937,470
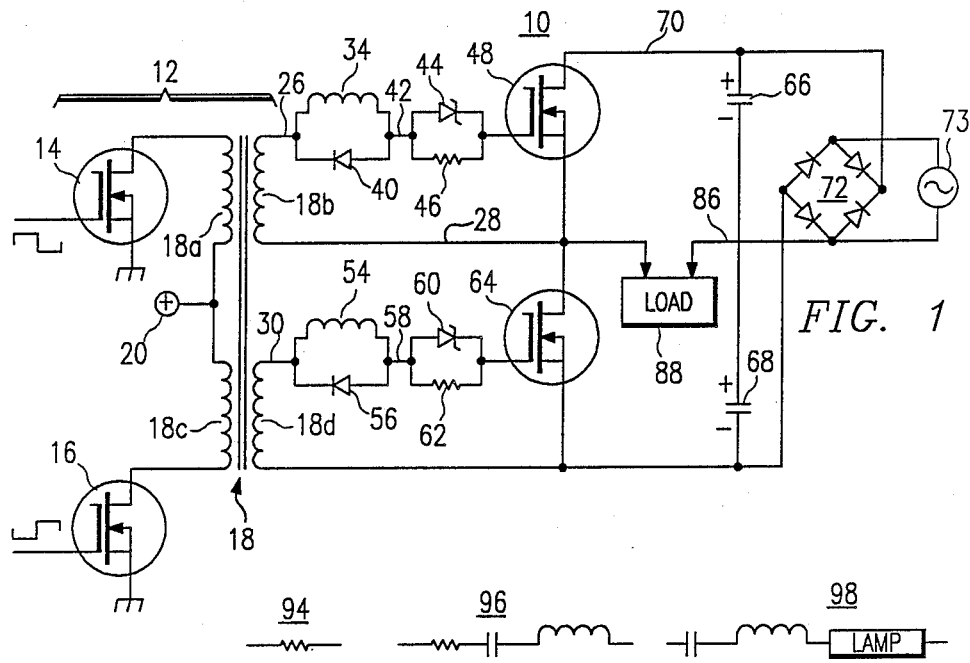
FIG. 1
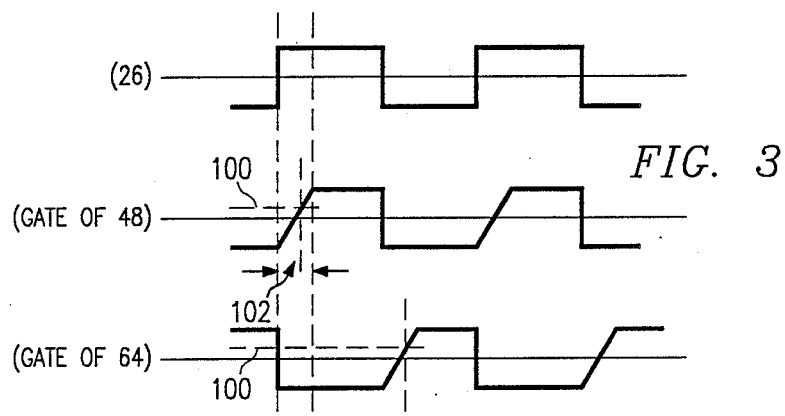
FIG. 2A    FIG. 2B    FIG. 2C
FIG. 3
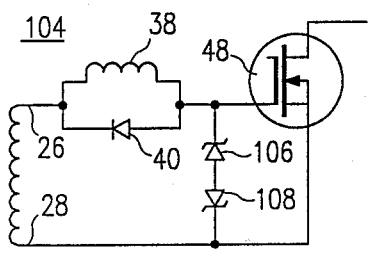
FIG. 4
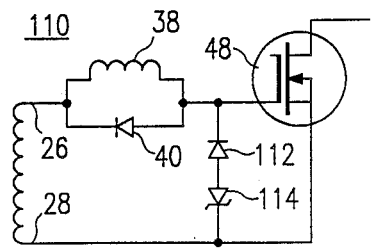
FIG. 5

DRIVER CIRCUIT FOR POWER TRANSISTORS

FIELD OF THE INVENTION

The present invention pertains to electronic circuitry and in particular to driver circuits for power transistors.

BACKGROUND OF THE INVENTION

Solid state power conversion devices that generate an AC or sinusoid type of output have special requirements with respect to uninterrupted or continuous power transmission. Gaps or interruptions in the output waveform cause severe radio frequency interference (RFI) or electromagnetic interference (EMI) which is difficult to suppress because any suppression network must also pass the desired AC waveform.

Conventional power control circuits use two output transistors, such that one transistor is on while the other is off. These transistors use a gate drive circuit that provides a positive voltage to the gate of one transistor while simultaneously supplying a negative voltage to the gate of the opposite transistor so that one transistor is on while the other is off. In order to insure that one transistor is completely off before the other is switched on, there is a delay between the negative transition of one gate drive signal and the positive transition of the other gate drive signal. This delay or "dead time" is designed so that variations in components, operating frequency and circuit noise will not defeat the dead time and cause both transistors to switch on simultaneously. The circuit could be seriously damaged if both transistors are turned on simultaneously because this would result in a very heavy current flow through the transistors and associated circuitry.

The dead time constitutes an interruption in the flow of power, and at high frequencies of operation, the dead time interval can constitute a significant percentage of each power pulse thereby limiting the total amount of power available at higher frequencies.

The present invention overcomes the problems with conventional gate drive circuits by minimizing the dead time while ensuring that there is no overlap in the on state of the power transistors. In addition it makes possible use of simple oscillators that do not incorporate sophisticated dead time circuitry.

SUMMARY OF THE INVENTION

A selected embodiment of the present invention is a driver circuit for switched power transistors which are connected in series between power terminals and alternately provide power to a load. The driver circuit includes a square wave signal source for providing a first square wave signal between first and second nodes and for providing a second square wave signal, which is the inverse of the first square wave signal, between third and fourth nodes. A first inductor and first diode are connected in parallel as a first parallel circuit. A first voltage clamping circuit is connected to the first parallel circuit and a control input for a first of the power transistors.

A second inductor and a second diode are connected in parallel to form a second parallel circuit. A second voltage clamping circuit is connected to the second parallel circuit and a control input for a second of the power transistors. Transitions of the first square wave signal to turn on the first transistor are forced by the first diode through the first inductor and are delayed by the first inductor. Opposite transitions of the first square wave signal, below a given threshold, pass through the first diode substantially bypassing the first inductor. Positive transitions of the second square wave signal are forced through the second inductor by the second diode and are delayed by the second inductor. Opposite transitions of the second square wave signal, below a given threshold, pass through the second diode substantially bypassing the second inductor. As a result, the power transistors have a greater turn-on time than turn-off time.

BRIEF DESCRIPTION OF THE DRAWINGS

For a more complete understanding of the present invention and the advantages thereof, reference is now made to the following description taken in conjunction with the accompanying drawings in which:

FIG. 1 is a schematic illustration of a gate driver circuit in accordance with the present invention, FIG. 2a is a resistive load FIG. 2b is a resistive, capacitive and inductive load FIG. 2c is a capacitive inductive lamp load, FIG. 3 is a set of waveforms representing signals for the circuit shown in FIG. 1, FIG. 4 is an alternative driver configuration of the gate drive of the power transistors shown in FIG. 1, and FIG. 5 is a still further alternative for the gate drive configuration for the power transistor shown in FIG. 1.

DETAILED DESCRIPTION

The present invention is a circuit for providing a drive signal to power transistors particularly where the frequency of the drive signal is variable. In conventional practice there is a required dead time to prevent push-pull transistors from being activated at the same time. When this dead time is fixed and a variable frequency drive signal is used, the dead time percentage increases as the duration of the drive pulse decreases. At high frequencies a substantial portion of the power, which should be delivered to the load, is lost.

A driver circuit 10 in accordance with the present invention is illustrated in FIG. 1. A square wave circuit 12 includes field effect transistors 14 and 16 which receive inverse drive signals at the gate control terminals. These transistors are, for example, a Model IRF512 manufactured by Unitrode. A transformer 18 has primary windings 18a and 18c and secondary windings 18b and 18d. The drain of transistor 14 is connected to winding 18a. The remaining terminal of winding 18a is connected to a center tap 20. The second primary winding 18c is connected between the center tap 20 and the drain electrode of transistor 16.

The secondary winding 18b is connected between a node 26 and a node 28. The secondary winding 18d is connected between nodes 30 and 32. Windings 18b and 18d are configured as shown with the conventional dot notation for transformers.

An inductor 38 is connected in parallel with a diode 40 between node 26 and a node 42. The anode of diode 40 is connected to node 42.

A zener diode 44 is connected in parallel with a resistor 46 between node 42 and the gate control terminal of a power transistor 48. The anode of zener diode 44 is connected to node 42.

The combination of zener diode 44 and resistor 46 is a voltage clamping circuit which limits the voltage at the gate of transistor 48. Zener diode 60 and resistor 62 are likewise a voltage clamping circuit.

An inductor 54 is connected in parallel with a diode 56 between node 30 and a node 58. The anode of diode 56 is connected to node 58. A zener diode 60 is connected in parallel with a resistor 62 between node 58 and the gate control terminal of a power transistor 64. The anode of zener diode 60 is connected to node 58.

A selected value for each of the inductors 38 and 54 is 100 microhenries and for resistors 46 and 62 is 100 ohms. Zener diodes 44 and 60 are a model 1N4734 made by Motorola, Inc. and have a 5.6 v breakdown voltage.

The transistors 48 and 64 are, for example, a Model IRF441 manufactured by Motorola.

The source terminal of transistor 48 is connected to node 28 and the drain terminal of transistor 64 is connected to node 28. The source terminal of transistor 64 is connected to node 32.

The power, which is switched by transistors 48 and 64, is taken from capacitors 66 and 68 which are connected in series between power terminal 70 and node 32.

The capacitors 66 and 68 function in conjunction with a four diode, bridge rectifier circuit 72 as a voltage doubler. The bridge rectifier circuit 72 is connected at opposite output tops between power terminal 70 and a node 86. The bridge rectifier circuit 72 is connected to an AC power source 73. A representative power voltage across each of the capacitors 66 and 68 is 200 volts.

A selected component value for each of the capacitors 66 and 68 is 680 microfarad.

The junction of capacitors 66 and 68 is at node 86. A load 88 is connected between nodes 28 and 86. This load can be a circuit loader or a motor load further described in reference to FIGS. 2a-2c.

The resistors 46 and 62 serve to dampen inductor ringing and to provide a passive ground path to keep the gates of transistors 48 and 64 discharged even when the gates are quiescent.

In reference to FIG. 2a there is shown a resistive load 94, and in FIG. 2b there is a resistive, capacitive and inductive load 96 and in FIG. 2c there is a capacitive inductive lamp load 98. Any of the loads shown in FIGS. 2a-2c can be utilized as the load 88 shown in FIG. 1. The load 88 may also be a circuit load or almost any kind of power consuming load.

FIG. 3 is a representation of waveforms which occur in the circuit shown in FIG. 1. These include the square wave at node 26 and the driving waveforms at the gate of transistors 48 and 64.

Operation is now described for the circuit 10 shown in FIG. 1 in conjunction with the loads shown in FIGS. 2a-2c and the waveforms shown in FIG. 3. The power transistors 48 and 64 operate in a push-pull fashion in conjunction with the voltage doubler capacitors 66 and 68. These transistors switch the power that is applied to the load 88. In a conventional driver circuit the gate control terminals of the transistors 48 and 64 are driven by signals which are substantially inverse but have a dead time preceding the turn on of each transistor. This dead time prevents the power transistors from being turned on concurrently. However, this dead time also reduces the amount of power that is transferred to the load 88. At low operating frequencies, the dead time may not be significant, and the percentage of power loss due to the dead time can be small. However, if the transistors 48 and 64 are used to drive a load at high frequencies, the fixed dead time can become a substantial percentage of the power period for each transistor, thereby reducing the power that is delivered to the load 88. An example of the load 88, driven by the circuit 10, is a lamp. For the present application, the preferred lamp is a gas discharge device which requires an AC driving signal. However, the driver circuit in accordance with the present invention is not limited to just such a device, but could be used in conjunction with any load, including the loads shown in FIGS. 2a-2c.

The square wave circuit 12, which includes the transformer 18 and transistors 14 and 16, produces the square wave signal shown in FIG. 3 for node 26. An inverse of this square wave signal is produced at node 30. The signals at 26 and 30 are tightly coupled, that is, they have no defined dead time between them. This is due to the action of the transistors 14 and 16 in driving the windings 18a and 18c. When one of these two transistors is turned on, it creates a current flow through the corresponding winding which does not immediately decay even if the driving transistor is turned off. The current flowing through the windings 18a and 18c is not terminated and reversed until the other of the transistors is affirmatively turned on. This eliminates any dead time that may be present in the driving signals for the transistors 14 and 16.

The output windings 18b and 18d are oppositely polarized to produce inverse square wave signals at nodes 26 and 30. When node 26 is driven positive relative to node 28, which is a positive transition of the square wave signal, this positive transition is blocked by the diode 40 and forced through the inductor 38. The high frequency components of this fast rise time signal are delayed by the inductor 38 to produce the corresponding time period slope as shown in FIG. 3 for the positive transition of the drive signal at the gate of transistor 48. This positive transition of the drive signal then passes through the zener diode 44 to the gate control terminal of transistor 48. The zener diode 44 is forward biased to bypass the resistor 46 and more quickly charge the gate capacitance of the gate terminal of transistor 48. The turn-on threshold of transistor 48 is shown as line 100 in FIG. 3. This is the same threshold for transistor 64. The actual turn on of transistors 48 and 64 occurs when the gate drive reaches the threshold 100.

When the square wave signal at node 26 transitions from the high to the low state, a reverse polarity is applied to the transistor 48. Charge must be withdrawn from the gate capacitance of transistor 48 in order to turn it off. It is important that this be done as rapidly as possible. The reverse drive signal bypasses the inductor 38 through the diode 40 and, when it exceeds the threshold of zener diode 44, bypasses the resistor 46. This voltage clamping action also protects the resistor 46 from a surge current. The effect of. bypassing the impedance elements of the parallel circuits is a dramatically rapid discharge of the gate capacitance of the power transistor 48. This is illustrated by the rapid transition from the high to the low state for the gate drive signals for transistors 48 and 64 as shown in FIG. 3.

The action of the drive circuitry for transistor 64 is the same as that described above for the transistor 48.

As shown by the above description, the turn-on of the power transistors is delayed by the action of the inductor 38. The combination of the drive elements provides a rapid reverse drive to cause the power transistors to have a sudden turn off.

The actual delay time provided by the inductor 38 or 54 is a function of the value of the inductance and the capacitance of the gate control electrode for the corresponding power transistor. This delay time can be selected to be any desired time by selection of the impedance for the corresponding inductor.

Further referring to FIG. 3, the time delay between the turn off of one transistor and the turn on of another transistor is shown by the time period 102.

An alternative voltage clamping circuit to that shown in FIG. 1 is illustrated in FIG. 4. Only a portion of the overall circuit is illustrated with the reference numerals in FIG. 1 being reproduced in FIG. 4 for the same elements. Circuit 104 does not include the zener diode 44 and resistor 46. In place of these elements there are provided zener diodes 106 and 108 which are connected in a back to back configuration between the control terminal of transistor 48 and node 28. Diodes equivalent to 106 and 108 are configured as shown for circuit 104 to replace zener diode 60 and resistor 62 in circuit 10. The anode terminals of the zener diodes are connected together. Each of these diodes is approximately a 15 volt zener diode. These zener diodes serve to clamp the maximum voltage that can be applied to the control terminal of the transistor 48. When the negative transition of the square wave is applied between nodes 26 and 28, the combination of the zener diodes 106 and 108 does not conduct below the zener diode voltage and directs the current from the gate of transistor 48 through the diode 40. When the zener diode voltage is exceeded, the current from the gate of transistor 48 is transferred directly to the node 28.

A still further embodiment of the present invention is illustrated as a circuit 110 in FIG. 5. The common elements maintain common reference numerals. The difference between circuit 10 and circuit 110 is that the zener diode 44 and resistor 46 have been removed and node 42 is connected to the control terminal of transistor 48. Added to that shown in circuit 10 is a diode 112 and a zener diode 114 connected in series between the control terminal of transistor 48 and node 28. A configuration similar to a diode 112 and zener diode 114 is present in the lower portion of circuit 10 between the control input of transistor 64 and node 32. Likewise, the zener diode 60 and resistor 62 are deleted.

In the circuit 110, when the control terminal of transistor 48 receives a positive transition, the diode 112 blocks all transfer directly to the node 28 and all current passing through the inductor 38 is applied to the gate terminal of transistor 48, but in the reverse bias condition, when the transistor 48 is being turned off, a maximum excursion is limited by the turn on of the zener diode 114.

In summary, the present invention is a driver circuit that provides a safe delay to prevent the concurrent activation of switched power transistors, but the delay can be made extremely short to provide a very high power factor when driving a load with an alternating power source.

Although several embodiments of the invention have been illustrated in the accompanying drawings and described in the foregoing Detailed Description, it will be understood that the invention is not limited to the embodiments disclosed, but is capable of numerous rearrangements, modifications and substitutions without departing from the scope of the invention.

What I claim is:

1. A driver circuit for switched transistors which are connected through load terminals thereof to a load to alternately provide power to the load, comprising:
   a square wave signal source for providing a first square wave signal between first and second nodes and for providing a second square wave signal, which is the inverse of said first wave signal, between third and fourth nodes, said second and fourth nodes connected to said respective load terminals of said transistors,
   a first inductor and a first diode connected in parallel to form a first parallel circuit,
   a first voltage clamping circuit connected to the control terminal of a first of said transistors, said first parallel circuit connected between said first node and said first voltage clamping circuit,
   a second inductor and a second diode connected in parallel to form a second parallel circuit,
   a second voltage clamping circuit connected to the control terminal of a second of said transistors, said second parallel circuit connected between said third node and said second voltage clamping circuit, and
   wherein said square wave signals having positive-going and negative-going signal transitions, a first of said transitions of said first square wave signal, which first signal transitions turn on said first transistor, reverse bias said first diode and are forced through said first inductor by said reversed biased first diode and are delayed by said first inductor, and a second of said transitions of said first square wave signal forward bias said first diode and passes through said forward biased first diode substantially bypassing said first inductor, wherein the second of said first square wave signal transitions is amplitude limited by said first voltage clamping circuit, and a first of said transitions of said second square wave signal, which second signal transitions turn on said second transistor, reverse bias said second diode and are forced through said second inductor by said reverse biased second diode and are delayed by said inductor and a second of said transitions of said second square wave signal forward bias said second diode and pass through said second diode substantially bypassing said second inductor, wherein the second of said second square wave signal transitions is amplitude limited by said second voltage clamping circuit, whereby the turn-on time for said transistors is greater than the turn-off time for said transistors.

2. A driver circuit as recited in claim 1 wherein said first voltage clamping circuit comprises a first zener diode connected in parallel with a first resistor between said first parallel circuit and the control input of said first transistor and said second voltage clamping circuit comprises a second zener diode connected in parallel with a second resistor between said second parallel circuit and the control input of said second transistor.

3. A driver circuit as recited in claim 1 wherein said first voltage clamping circuit comprises first and second back to back zener diodes connected serially between said control terminal for said first transistor and said second node and said second voltage clamping circuit comprises third and fourth back to back zener diodes connected serially between the control terminal for said second transistor and said fourth node.

4. A driver circuit as recited in claim 1 wherein said first voltage clamping circuit comprises a first zener diode connected in series with a third diode between a control input for said first transistor and said second node and said second voltage clamping circuit comprises a second zener diode connected in series with a fourth diode between the control input for said second transistor and said fourth node.

5. A driver circuit for switched transistors which are connected in series between power terminals and alternately provide power to a load through respective load terminals of said transistors, comprising:
- a square wave signal source for providing a first square wave signal between first and second nodes and for providing a second square wave signal, which is the inverse of said first wave signal, between third and fourth nodes, said second and fourth nodes connected to the respective load terminals of said transistors,
- a first inductor and a first diode connected in parallel to form a first parallel circuit,
- a first zener diode and a first resistor connected in parallel to form a second parallel circuit, said first and second parallel circuit connected in series between said first node and a control input for a first of said switched transistors,
- a second inductor and a second diode connected in parallel to form a third parallel circuit,
- a second zener diode and a second resistor connected in parallel to form a fourth parallel circuit, said third and fourth parallel circuit connected in series between said third node and a control input for a second of said switched transistors, and
- wherein said square wave signals having positive-going and negative-going signal transitions, a first of said transitions of said first square wave signal which first signal transitions turn on said first transistor, reverse bias said first diode and are forced by said reverse biased first diode through said first inductor and are delayed by said first inductor and pass through said first zener diode substantially bypassing said first resistor and a second of said transitions of said first square wave signal reverse bias said first zener diode and also are amplitude limited thereby and are driven through said first resistor by said reverse biased first zener diode and forward bias said first diode to pass through said first diode substantially bypassing said first inductor, and a first of said transitions of said second square wave signal which first signal transmissions turn on said second transistor, reverse bias said second diode and are forced by said reverse biased second diode through said second inductor and are delayed by said second inductor and forward bias said second zener diode to substantially bypass said second resistor and pass through said forward biased second zener diode and a second of said transitions of said second square wave signal, forward bias said second diode and pass through said second diode substantially bypassing said second inductor and reverse bias said second zener diode and are amplitude limited thereby and are driven through said second resistor by said reverse biased second zener diode, whereby the turn-on time of said transistors is greater than the turn-off time of said transistors.

* * * * *

UNITED STATES PATENT AND TRADEMARK OFFICE
CERTIFICATE OF CORRECTION

PATENT NO. : 4,937,470
DATED : June 26, 1990
INVENTOR(S) : Kenneth T. Zeiler

It is certified that error appears in the above-identified patent and that said Letters Patent is hereby corrected as shown below:

Col. 6, line 2, immediately following the word "first", please insert the word -- square --.

Col. 6, line 38, immediately following the word "said", please insert the word -- second --.

Col. 7, line 28, please delete the word "having" and substitute therefor the word -- have --.

Signed and Sealed this

Fourth Day of May, 1993

Attest:

MICHAEL K. KIRK

Attesting Officer

Acting Commissioner of Patents and Trademarks